(12) United States Patent
Chen

(10) Patent No.: US 8,772,647 B1
(45) Date of Patent: Jul. 8, 2014

(54) SINGLE-CAP VIA-IN-PAD AND METHODS FOR FORMING THEREOF

(75) Inventor: Chien Te Chen, Fongyuan (TW)

(73) Assignee: Marvell International Ltd, Hamilton (BM)

( * ) Notice: Subject to any disclaimer, the term of this patent is extended or adjusted under 35 U.S.C. 154(b) by 0 days.

(21) Appl. No.: 13/443,508

(22) Filed: Apr. 10, 2012

Related U.S. Application Data

(62) Division of application No. 12/026,429, filed on Feb. 5, 2008, now Pat. No. 8,161,635.

(60) Provisional application No. 60/888,394, filed on Feb. 6, 2007.

(51) Int. Cl.
*H01K 3/10* (2006.01)
*H05K 1/11* (2006.01)

(52) U.S. Cl.
USPC .......................................... 174/262; 29/852

(58) Field of Classification Search
USPC .................... 174/262–266; 361/792–795; 29/852–853
See application file for complete search history.

(56) References Cited

U.S. PATENT DOCUMENTS

| | | | |
|---|---|---|---|
| 3,812,442 A | 5/1974 | Muckelroy | |
| 6,742,247 B2 | 6/2004 | Pai et al. | |
| 6,856,008 B2 | 2/2005 | Pai et al. | |
| 7,612,295 B2 * | 11/2009 | Takada et al. | 174/260 |
| 2006/0272850 A1 * | 12/2006 | Morimoto et al. | 174/254 |

OTHER PUBLICATIONS

U.S. Appl. No. 12/026,429, filed Feb. 5, 2008, Chien Te Chen, "Single-Cap Via-In-Pad and Methods for Forming Thereof", 32 pages.

* cited by examiner

Primary Examiner — Jeremy C Norris

(57) ABSTRACT

Methods for the formation of single-cap VIPs in a substrate are described herein. The methods may include initially providing a substrate having a first and a second side, the first side being opposite of the second side. A via may then be constructed in the substrate, the via being formed within a via hole that extends from the first side to the second side of the substrate, the formed via having a first end located at the first side of the substrate, and a second end opposite the first end located at the second side of the substrate. A selective deposition may be performed of a conductive material on the second end of the via to form a conductive pad directly on the via on the second side of the substrate without depositing the conductive material onto the first side of the substrate.

11 Claims, 9 Drawing Sheets

SINGLE-CAP VIA-IN-PAD AND METHODS FOR FORMING THEREOF

CROSS-REFERENCE TO RELATED APPLICATIONS

The present application is a divisional of U.S. patent application Ser. No. 12/026,429, filed Feb. 5, 2008, which claims priority to U.S. Provisional Patent Application No. 60/888,394, "One Side Cap In VIP Substrate," filed Feb. 6, 2007, the entire disclosure of which is hereby incorporated by reference in its entirety.

TECHNICAL FIELD

Embodiments of the present invention relate to the field of electronic devices, and in particular, to electronic devices with via-in-pad (VIP) structures, and fabrication thereof.

BACKGROUND

In the current state of integrated circuit technology, an integrated circuit device will often be in the form of a die. Such a die will typically be mounted onto an underlying substrate such as an underlying carrier or package substrate to form a "package." The package may then be mounted onto another substrate such as a printed circuit board (PC). Each of these substrates (i.e., die, carrier substrate, and PCB) is typically connected to another substrate using conductive pads and conductive interconnects. For example, a carrier substrate may be coupled to a PCB via conductive pads and conductive interconnects such as solder balls. Each of these substrates may further include a number of electronic components such as capacitors, transistors, resistors, and so forth that are coupled together by conductive lines.

The conductive lines, which for purposes of this description will be referred to as "intraconnects," may be classified into at least two types, traces and vias. Traces are conductive lines that run horizontally in or on top of the substrates, while vias run vertically in the substrates. In some substrates, a via may be coupled to a conductive pad to form a structure called a via-in-pad (VIP). In these VIP structures, the via may be located directly underneath (or on top of depending on point of reference) the conductive pad.

In a continual effort to reduce the overall size of these electrical devices, the components of these substrates are being increasingly crammed closer and closer together, thus reducing the pitch (i.e., distance) between the components. Unfortunately, because of the specific types of processes used to form the various components disposed within and on top of these substrates, it is becoming more difficult to continue to reduce the pitch distance between components.

SUMMARY OF THE INVENTION

According to various embodiments of the present invention, novel methods are provided that result in the formation of single-cap VIPs in a substrate. As a result, fine pitch trace patterns may be formed on the substrate. The methods may include initially providing a substrate having a first and a second side, the first side being opposite of the second side. A via may then be constructed in the substrate, the via being formed within a via hole that extends from the first side of the substrate to the second side of the substrate, the formed via having a first end located at the first side of the substrate, and a second end opposite the first end located at the second side of the substrate. A selective deposition may be performed of a first conductive material on the second end of the via to form a conductive pad directly on the via on the second side of the substrate without depositing the first conductive material onto the first side of the substrate.

In some embodiments, the selective deposition may comprise placing a mask on the substrate that covers at least the first side of the substrate including the first end of the via, and removing the mask after said deposition of the first conductive material on the second end of the via. For these embodiments, the selective deposition may further comprise placing the mask on the substrate to cover the second side of the substrate, and patterning the mask to provide at least an opening to expose the second end of the via, and depositing the first conductive material into the opening to form a conductive pad directly on the via.

In some embodiments, the substrate to be provided may include a core with a first and a second side corresponding to the first and second sides of the substrate, respectively, and a layer of a second conductive material deposited on the first and second sides of the core. For these embodiments, the construction of the via may include forming a via hole in the substrate that is defined by one or more substrate walls, and plating at least the one or more walls with a third conductive material. The via hole, in some embodiments, may be filled with a plug material.

In some embodiments, a trace pattern may be formed on the first side of the substrate. For these embodiments, the methods may further include depositing a layer of the third conductive material on the layer of the second conductive material on the first side of the substrate, and the forming of a trace pattern may include patterning the layers of second and third conductive materials on the first side of the substrate to form the trace pattern on the first side of the substrate.

In some embodiments, another trace pattern may be formed on the second side of the substrate. For these embodiments, the methods may further include depositing a layer of the third conductive material on the layer of the second conductive material on the second side of the substrate, and the formation of a trace pattern on the second side of the substrate may comprise of patterning the layers of second and third conductive materials on the second side of the substrate to form the another trace pattern on the second side of the substrate.

In various embodiments of the present invention, methods are provided that include providing a substrate having a via, the via formed within a via hole that extends from a first side to a second side of the substrate, the second side being opposite of the first side, the via comprising a first conductive material and having a first end located at the first side of the substrate, and a second end opposite the first end located at the second side of the substrate. For these embodiments, the methods may further include constructing a conductive pad with a second conductive material at the second end of the via, the constructing including selectively depositing the second conductive material directly on the second end of the via on the second side of the substrate without depositing the second conductive material onto the first side of the substrate, and forming a trace pattern on the first side of the substrate by patterning a layer of the first conductive material deposited on top of the first side of the substrate.

In some embodiments, the methods may further include forming the via hole in the substrate and plating one or more walls of the via hole with the first conductive material. For these embodiments, the via hole may then be filled with a plug material to form the via.

In some embodiments, the substrate to be provided may include a core with a first and a second side corresponding to the first and second sides of the substrate, respectively, and a layer of a third conductive material deposited on the first and second sides of the core. In some embodiments, the first and third conductive materials comprise copper.

In some embodiments, plating of the one or more walls of the via hole may further include depositing a layer of the first conductive material on the layer of the third conductive material on the first side of the substrate, and patterning the layers of the first and third conductive materials on the first side of the substrate to form the trace pattern. For these embodiments, the plating of the one or more walls may further include depositing a layer of the first conductive material on the layer of the third conductive material on the second side of the substrate, and patterning the layers of the first and third conductive materials on the second side of the substrate to form another trace pattern on the second side of the substrate.

In some embodiments, the selective deposition of the second conductive material comprises placing a mask on the substrate that covers at least the first side of the substrate including the first end of the via, and removing the mask after said deposition of the second conductive material onto the second end of the via. In some embodiments, the selective deposition may further include placing the mask on the substrate to cover the second side of the substrate, and patterning the mask to provide at least an opening to expose the second end of the via, and depositing the second conductive material into the opening to form the conductive pad directly on the via.

In accordance with various embodiments of the present invention, an apparatus is provided that includes, a substrate having a first and a second side, the first side being opposite of the second side, and a via-in-pad (VIP) structure integrated with the substrate, the VIP structure including a via formed within a via hole that extends from the first side to the second side of the substrate, the via having a first end located at the first side of the substrate, and a second end opposite the first end located at the second side of the substrate; and a cap comprising a first conductive material that is disposed on the second end of the via to form a conductive pad that is directly on the second end of the via, the first end of the via being without a corresponding cap comprising of the first conductive material.

In some embodiments, the via hole may be defined by one or more substrate walls, and the via may comprise a second conductive material plated on the one or more substrate walls. In some embodiments, the substrate comprises a core with a first and a second side corresponding to the first and second sides of the substrate, and the apparatus further comprises a trace pattern on the first side of the core, the trace pattern consisting of the second conductive material and a third conductive material.

In some embodiments, another trace pattern may be on the second side of the core, the another trace pattern comprising of the second conductive material and the third conductive material. In some embodiments, solder may be disposed on the conductive pad and opposite of the via.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," "some embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

According to various embodiments of the present invention, a method for forming one or more novel one-side cap via-in-pads (VIPs) in a substrate is provided that may allow for fine pitch trace patterns to be formed on the substrate. In accordance with these embodiments, it has been determined that attempts to reduce the pitch between traces of an electronic substrate, such as a carrier substrate, may be limited by the thickness of the conductive layer that the traces are to be formed from. That is, traces are typically formed from a layer of conductive material by patterning the layer of conductive material ("conductive layer"). The thicker the conductive layer, the more difficult it is to form fine pitch traces. Unfortunately, conventional techniques for forming VIPs in a substrate results in a relatively thick conductive layer being formed on the substrate for forming the trace patterns. Thus, novel methods are provided in accordance with various embodiments of the present invention for fabricating one-side cap VIPs or simply "single-cap VIPs" that may allow for fine pitch trace patterning to occur. As used herein, the phrase "fine pitch" refers to when the pitch distance between components, such as traces, is less than or equal to 100 to 110 μm.

Figure 1:
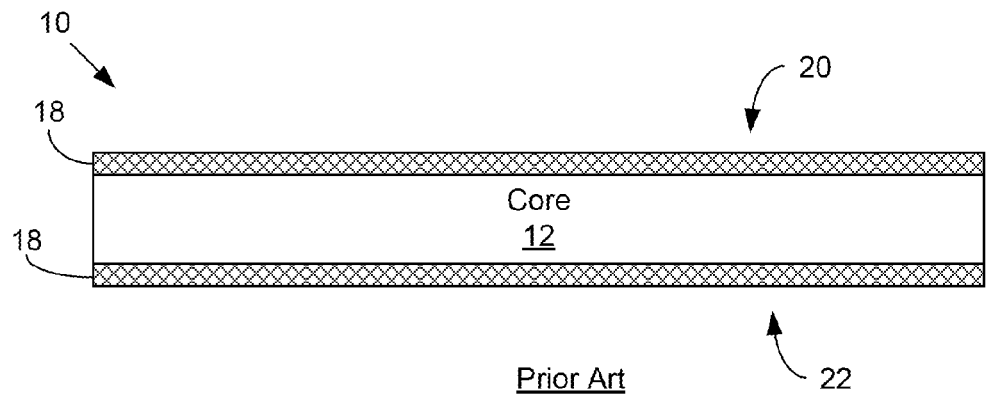
FIGS. 1 to 8 illustrate a substrate at various stages of a conventional process for forming a two-cap VIP structure in a substrate.

In order to appreciate different aspects of various embodiments of the present invention, FIGS. 1 to 8 are initially presented, which shows how a conventional two-side cap VIP or simply "two-cap VIP" is formed in a substrate using conventional techniques. The conventional process for forming a two-cap VIP typically begins when a substrate is provided as depicted in FIG. 1. The substrate 10 includes a core 12 having a first side 20 and a second side 22, and a layer of a conductive material 18 disposed on both sides of the core 12. The core 12 may comprise of epoxy, polyimide, RF4, and/or other ceramic or silicon material. The layer of the conductive material (herein "conductive layer") 18 is a copper layer or some other conductive layer.

Figure 2:
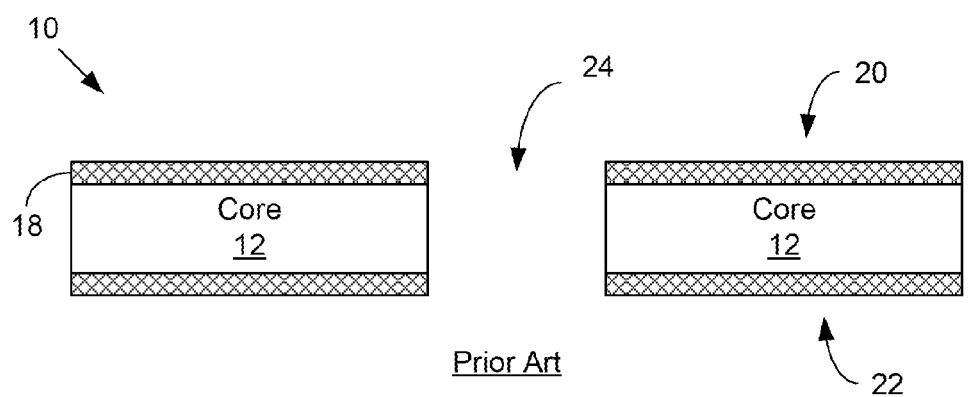
Figure 3:
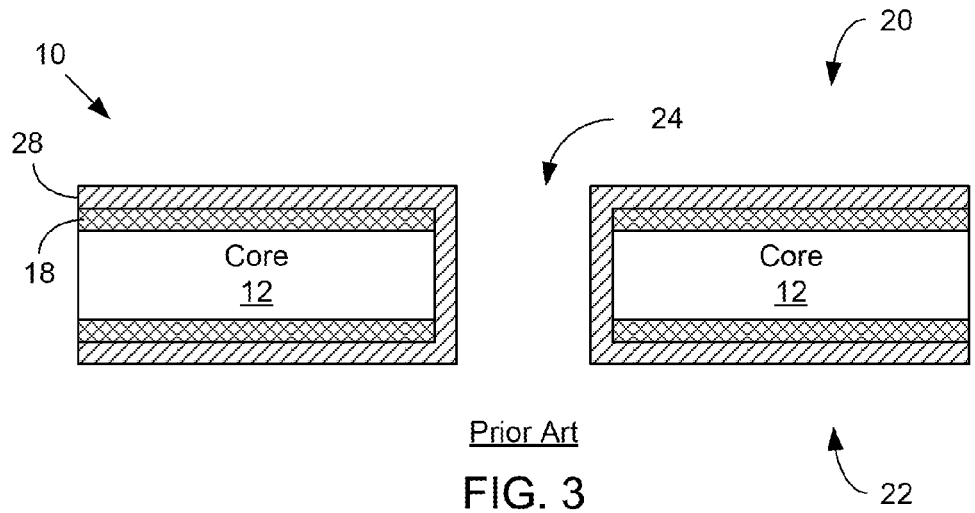
Figure 4:
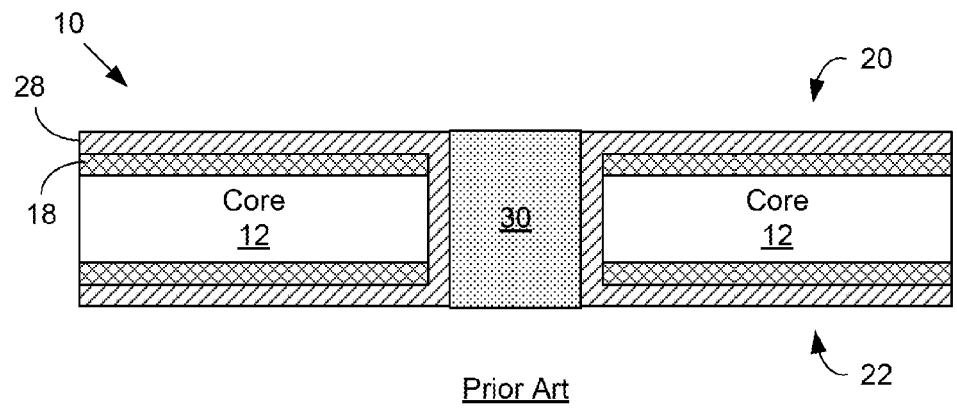
Figure 5:
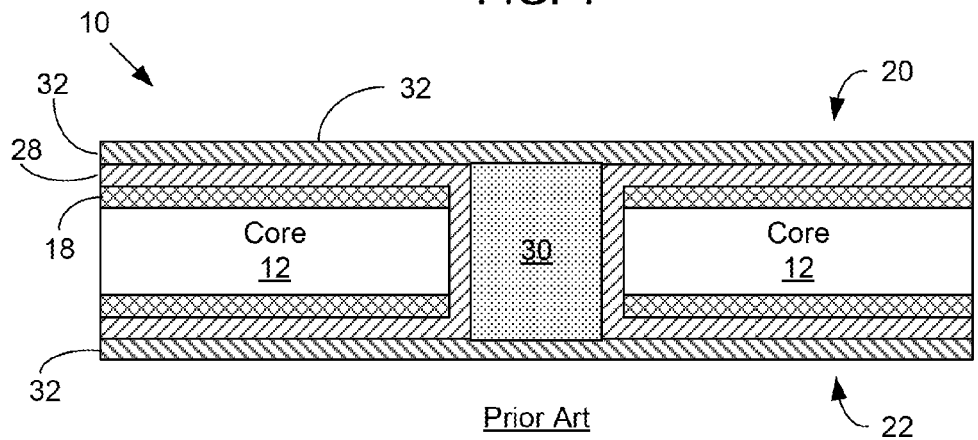

A via hole 24 is formed in the substrate 10 that extends from the first side 20 to the second side 22 of the substrate 10 as depicted in FIG. 2. A plating operation to plate the wall or walls of the via hole 24 with a layer of conductive material ("conductive layer") 28 is performed. As a result of such an operation, the first and second sides 20 and 22 of the substrate 10 are also typically plated with the conductive layer 28 as depicted in FIG. 3. A plug operation is then performed to fill the via hole 24 with a plug material 30, such as an epoxy, as depicted in FIG. 4. Next a cap plating operation is performed in order to deposit a layer of conductive material ("conductive layer") 32 on both sides 20 and 22 of the substrate 10 as depicted in FIG. 5. As a result of the deposition of the conductive layer 32, three conductive layers 18, 28, and 32 are disposed on both sides 20 and 22 of the substrate 10.

Figure 6:
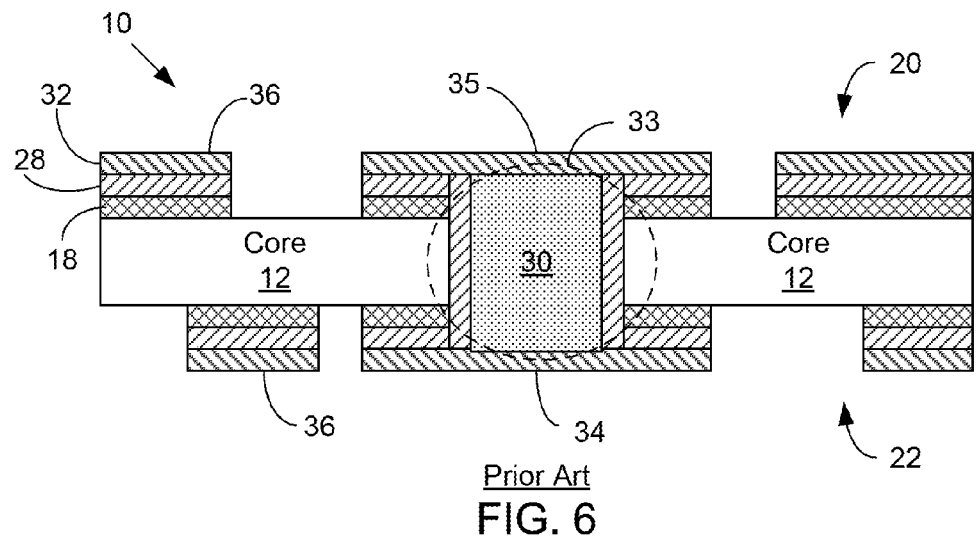

The conductive layers 18, 28, and 32 on both sides 20 and 22 of the substrate 10 is then patterned to form trace patterns on both sides 20 and 22 of the substrate 10 as depicted in FIG. 6. As a result of the patterning operation, traces 36 as well as caps 34 that are disposed at both ends of the via 33 (the via 33 includes the plug material 30 and the conductive layer 28 plated on the wall or walls of the via hole 24) are formed. Because of the relative thickness of the conductive layers 18, 28, and 32 on both sides 20 and 22 of the substrate 10, there may be a limit as to how small of a pitch can be realized between adjacent traces 36 on a surface of the substrate 10 (note that FIG. 6 does not show adjacent traces on a surface of the substrate 10). For example, suppose the thickness of the conductive layer 18, the conductive layer 28, and conductive layer 32, are 5 µm, 15~16 µm, and 10 µm, respectively, then the overall thickness of the conductive layers is approximately 30 µm. In FIG. 6, the overall "thickness" is the height of conductive layers 18, 28, and 32. As a result, and at best, trace patterns (i.e., traces) formed on the substrate 10 will have a pitch no smaller than 100 to 110 µm.

Figure 7:
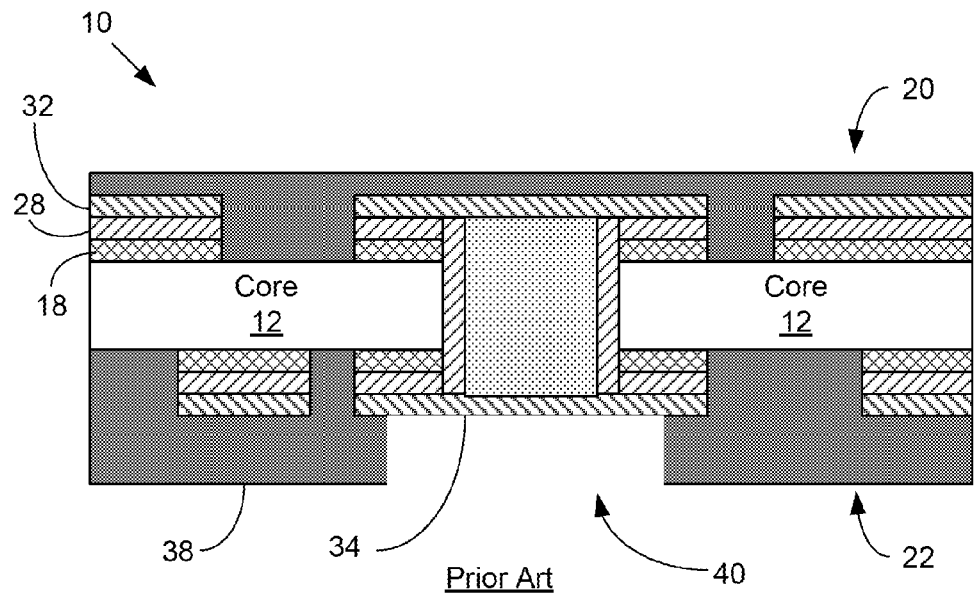
Figure 8:
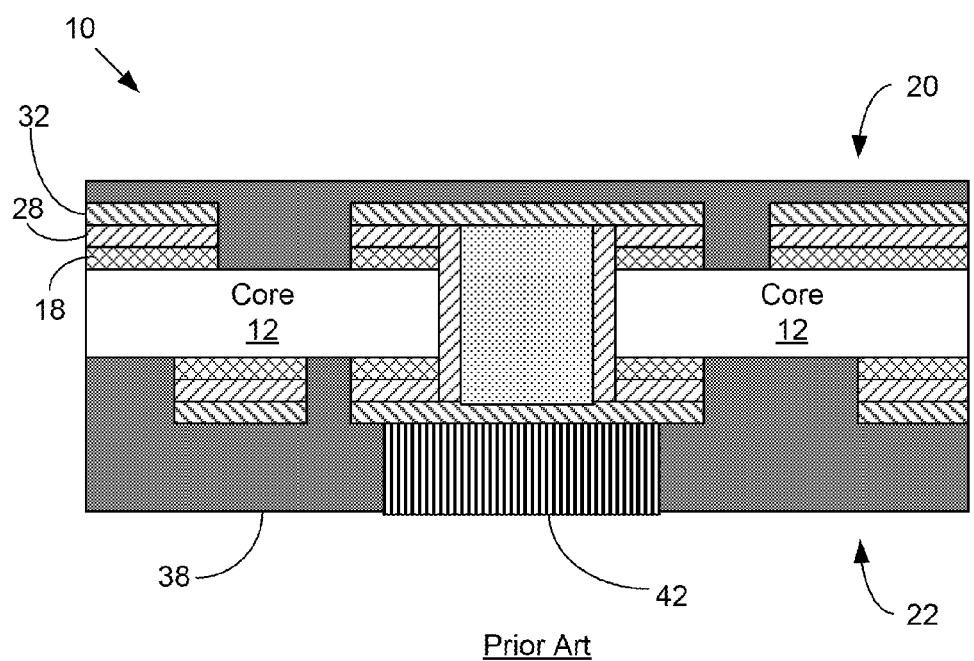

Thus, FIG. 6 illustrates a trace patterned substrate 10 with a VIP structure having a via 33 that are capped 34 and 35 on both ends of the via 33. Once the substrate 10 has been trace patterned, subsequent processes may be performed in order to electrically interconnect the substrate 10 to another substrate. For example, FIG. 7 depicts a solder mask 38 that has been printed or deposited onto both sides 20 and 22 of the substrate 10. The solder mask 38 includes an opening 40 that exposes the surface of the cap 34 disposed on the second side 22 of the substrate 10. The opening 40 is then filled with a conductive material 42, such as solder, to form an interconnect for electrically interconnecting the substrate 10 to another substrate as depicted in FIG. 8. Consequently, cap 34 represents a conductive pad for the VIP structure.

Figure 9:
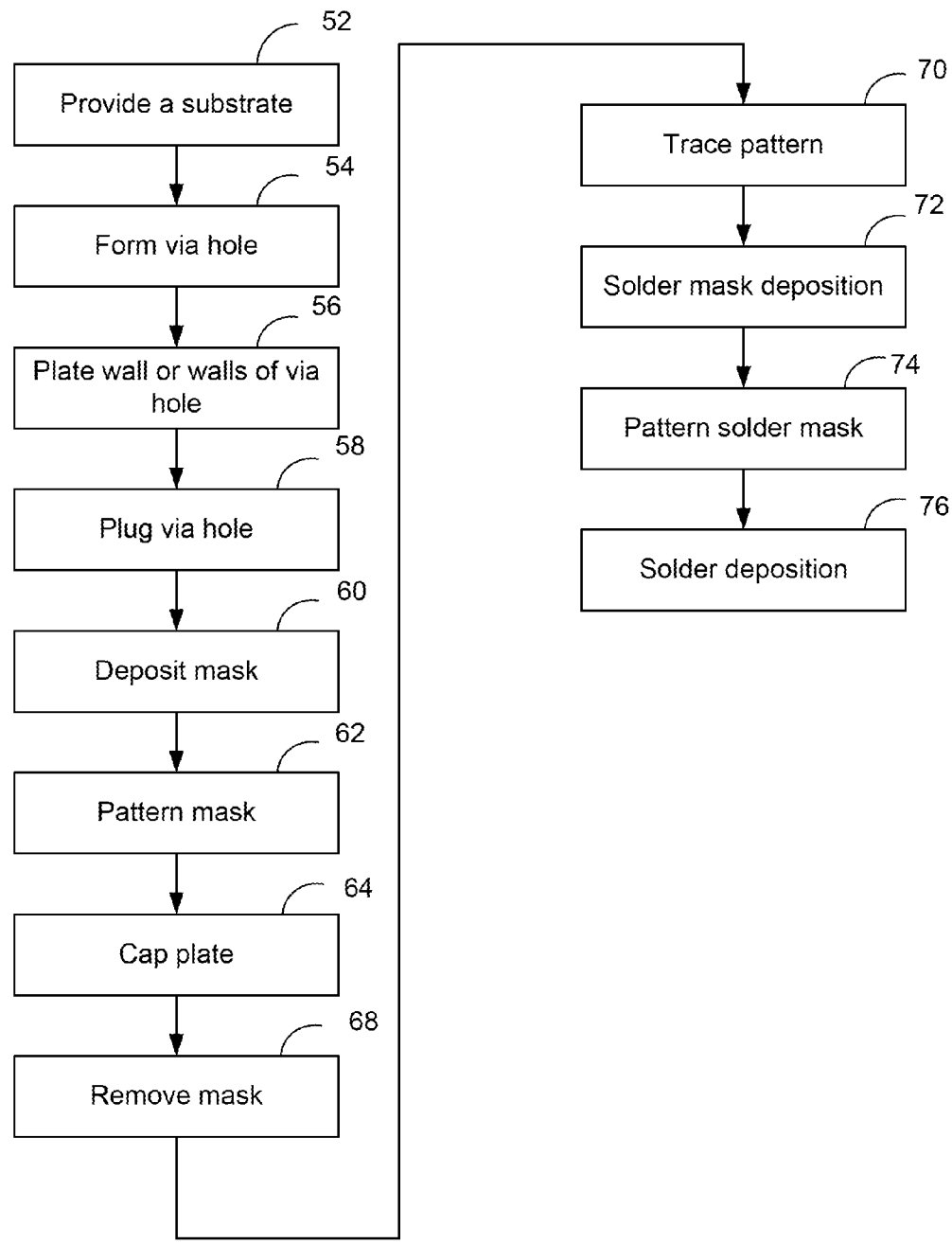
FIG. 9 illustrates a flow chart for forming a single-cap VIP structure in a substrate and for fine pitch trace patterning of the substrate, in accordance with various embodiments of the present invention.

Referring to FIG. 9, which is a flow chart of a process for forming one or more single-cap VIP structures in a substrate in accordance with various embodiment of the present invention. In particular, the process 50 may be employed in order to form fine pitch trace patterns on a substrate by employing methods for constructing one or more single-cap VIPs. The process 50 will be described in the following with reference to FIGS. 10 to 21, which depicts a portion of a substrate 50 at different stages of the process 50. For ease of illustration, the process 50 will be described with respect to the formation of only one single-cap VIP structure in a substrate. In alternative embodiments, however, the process 50 may be implemented in order to form multiple single-cap VIP structures in a substrate.

Figure 10:
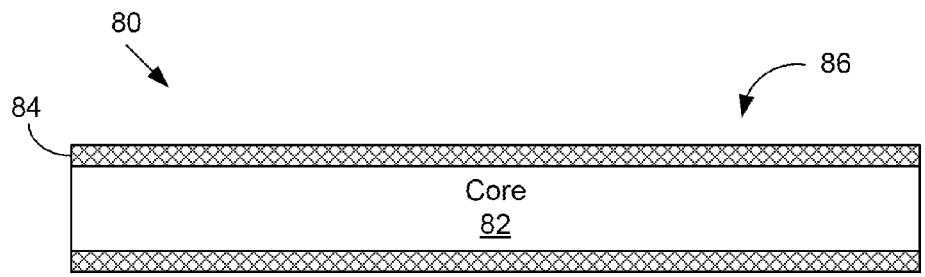
FIGS. 10 to 21 illustrate a substrate at different stages of the process of FIG. 9, in accordance with various embodiments of the present invention.

The process 50 may begin at block 52 when a substrate 80 is provided as depicted in FIG. 10. The substrate 80 may include a core 82 having a first side 86 and a second side 88, the first side 86 being opposite of the second side 88, and a layer of conductive material ("conductive layer") 84 that is disposed on both sides of the core 82. The core 82 may comprise epoxy, polyimide, RF4, and/or other material. Although not depicted, the core 82 may include electronic components such as transistors, capacitors, resistors, traces, vias, and so forth. The conductive layer 84 may be a copper layer or some other conductive layer.

Figure 11:
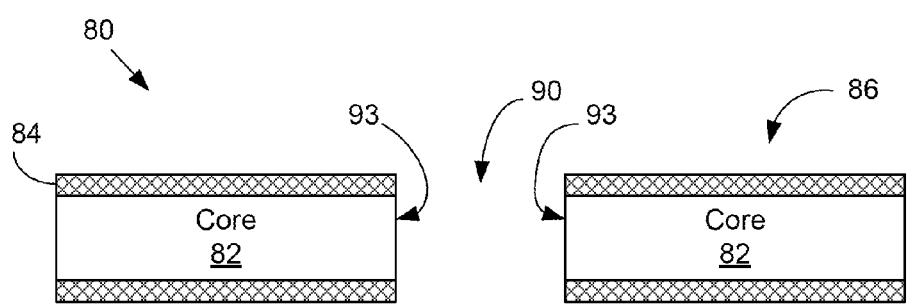
Figure 12:
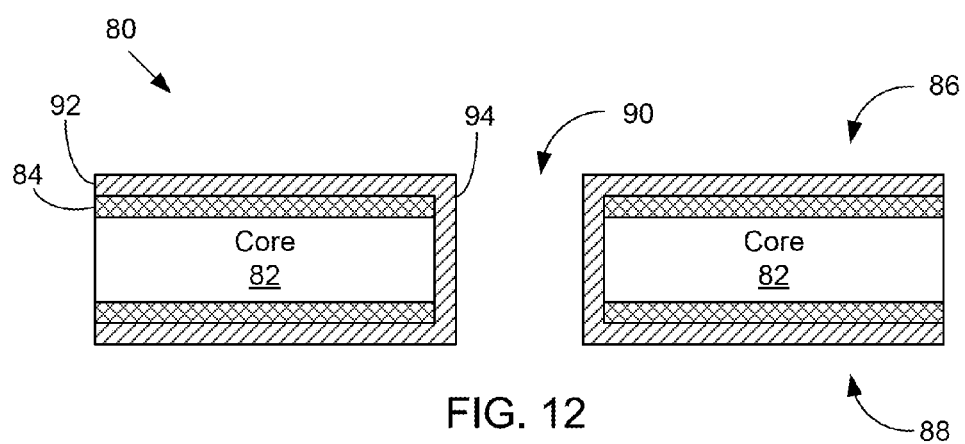
Figure 13:
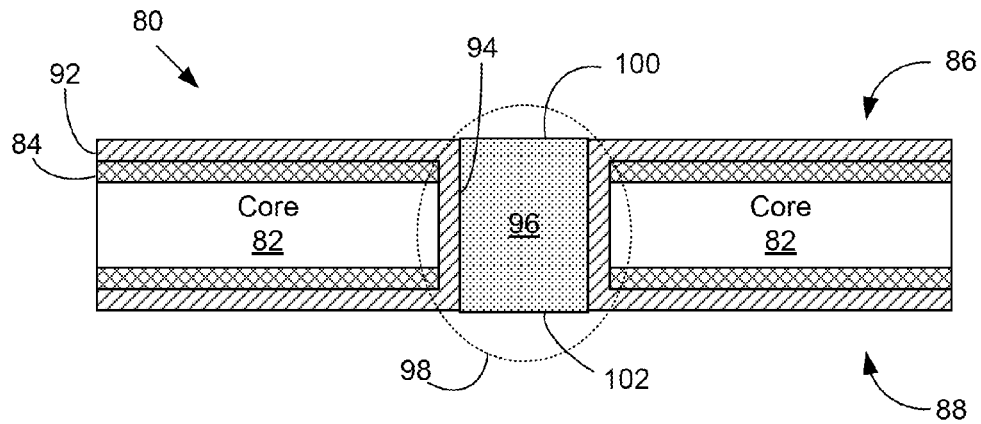

A via hole 90 may be formed in the substrate 80 at block 54 that extends from the first side 86 to the second side 88 of the substrate 80 as depicted in FIG. 11. The via hole 90 may be defined by one or more walls (herein "walls") 93 of the substrate 80. A plating operation at block 56 to plate the walls 93 of the via hole 90 with another layer of conductive material ("conductive layer") 92 may be performed. As a result of such an operation, the first and the second sides 86 and 88 of the substrate 80 may also be plated with the conductive layer 92 as depicted in FIG. 12. A plug operation at block 58 may then be performed to fill the via hole 90 with a plug material 96 as depicted in FIG. 13. In various embodiments, the plug material 96 may be a conductive or non-conductive epoxy or some other material. Once the via hole 90 has been filled, a via 98 is formed that includes at least the plug material 96 and the portion of the conductive layer 92 plated onto the walls 93 of the via hole 90. For purposes of this description, the portion of the conductive layer 92 plated onto the walls 93 of the via hole 90 will be referred to, for a lack of a better term, a via or wall conductive layer 94. The via 98 further includes a first end 100 and a second end 102 that are located on the first and second sides 86 and 88, respectively, of the substrate 80.

Figure 14:
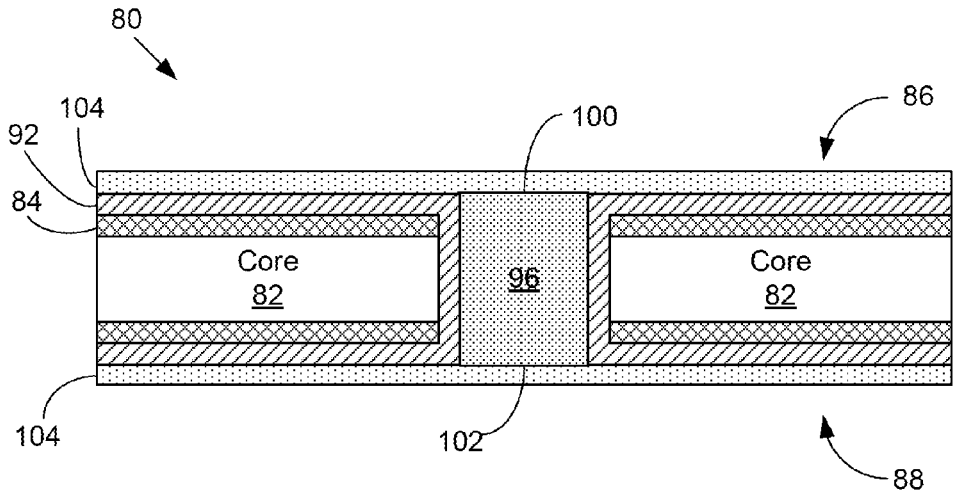

An operation to selectively deposit a conductive material at the second end 102 of the via 98 may be performed in order to create a conductive pad (i.e., cap) directly on the second end 102 of the via 98. The phrase "directly on" as used herein refers to the conductive pad being directly above (or below depending on point of reference) the via 98. In some embodiments, the selective deposition of the conductive material in order to form a conductive pad may be performed by initially depositing a mask 104 on both sides 86 and 88 of the substrate 80 at block 60 as depicted in FIG. 14. In various embodiments, the mask 104 may comprise, for example, dry film and/or glass film.

Figure 15:
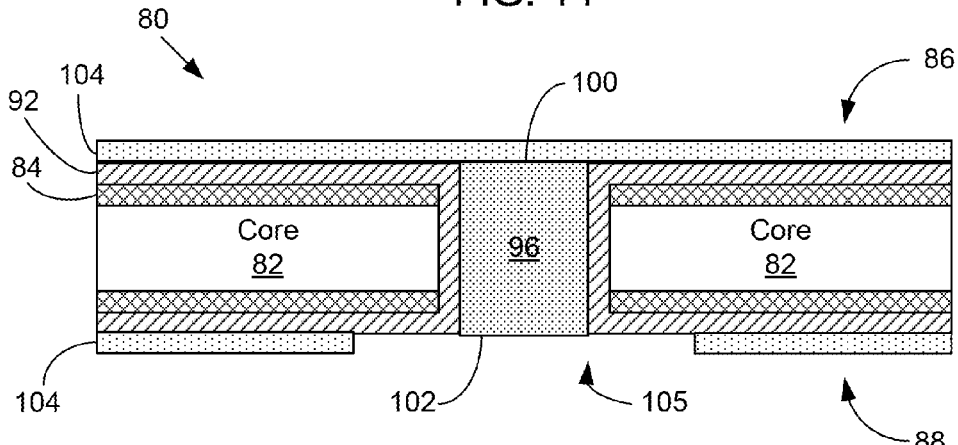
Figure 16:
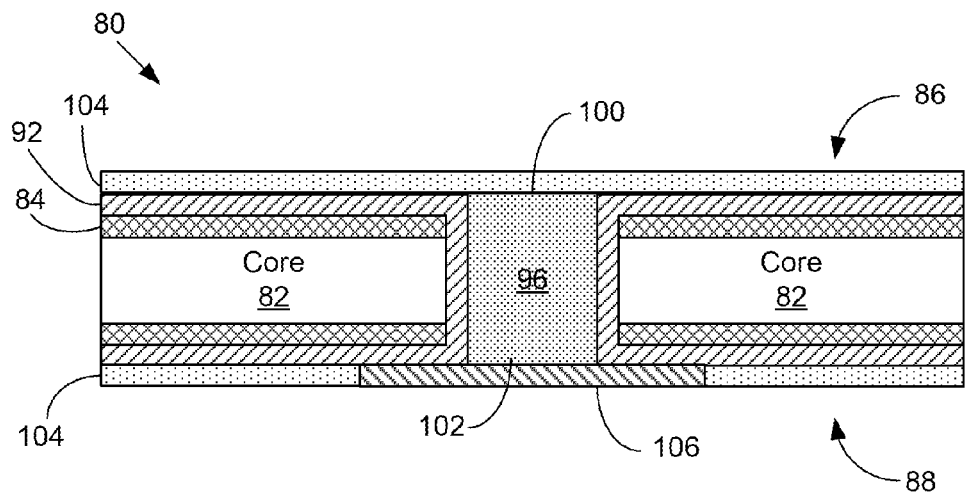
Figure 17:
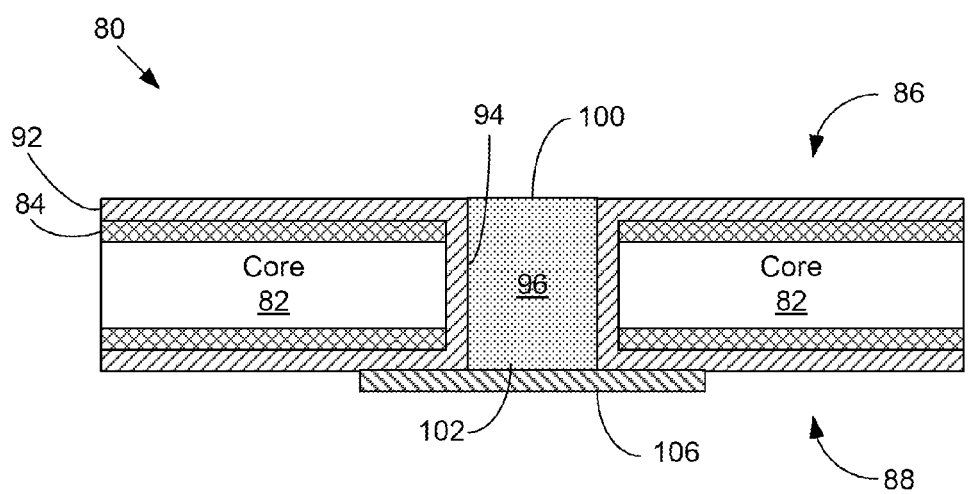

The mask 104 may then be patterned at block 62 to create an opening 105 that exposes the second end 102 of the via 98 while still covering at least the first end 102 of the via 98 as depicted in FIG. 15. In some embodiments, the entire first side 86 of the substrate 80 may remain covered with the mask 104 even after the patterning operation of the mask 104. A conductive material may then be deposited into the opening 105 in a cap plating operation at block 64 to form a conductive pad (or cap) 106 on the second end 102 of the via 98 as depicted in FIG. 16. The mask 104 may then be removed at block 68 as depicted in FIG. 17. In various embodiments, the conductive layers 84 and 92, and the conductive pad 106 may be comprised of the same conductive material, such as copper, or they may be comprised of different conductive materials. Blocks 60, 62, 64, and 68 represent the previously described selective deposition of conductive material in order to form a conductive pad 106 directly on the via 98. Other techniques for selective deposition of conductive material may also be employed in order to form a conductive pad in other alternative embodiments.

As a result of the selective deposition process, only two conductive layers 84 and 92 are plated onto the first side 86 of the substrate 80, which is unlike the earlier described conventional technique for forming two-cap VIPs in which three conductive layers 18, 28, and 32 are plated on the first side 20 of the substrate 10 (see, for example, FIG. 5). Because of the relatively thin conductive layer (i.e., conductive layers 82 and 92) disposed on the first side 86 of the substrate 80, fine pitch trace patterning of at least the first side 86 of the substrate 80 may be subsequently performed. In some embodiments, fine pitch patterning may also be performed on the second side 88 of the substrate 80 since the only area on the second side 88 of the substrate 80 to have three conductive layers (i.e., conductive layers 84 and 92 and conductive pad 106) rather than two conductive layers is the area below (or above depending on perspective) the VIP structure (i.e., plug material 96, wall conductive layer 94, and conductive pad 106).

Figure 18:
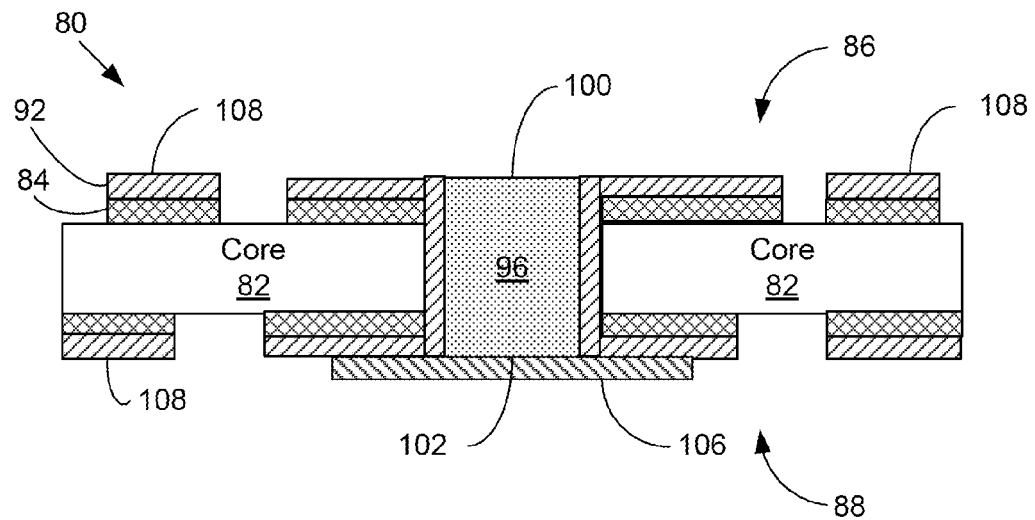

A trace patterning operation may then be performed at block 70 in order to create fine pitch trace patterns on the first side 86 and/or the second side 88 of the substrate 80 as depicted in FIG. 18. As a result, traces 108 are formed on both the first side 86 and the second side 88 of the substrate 80. In some embodiments, the trace patterning operation may be via etching or some other technique. In various embodiments, if the conductive layers 84 and 92 have a thickness of 20 μm, the resulting fine pitch trace patterns that are formed may have a pitch between traces of less than or equal to 100 to 110 μm.

Figure 19:
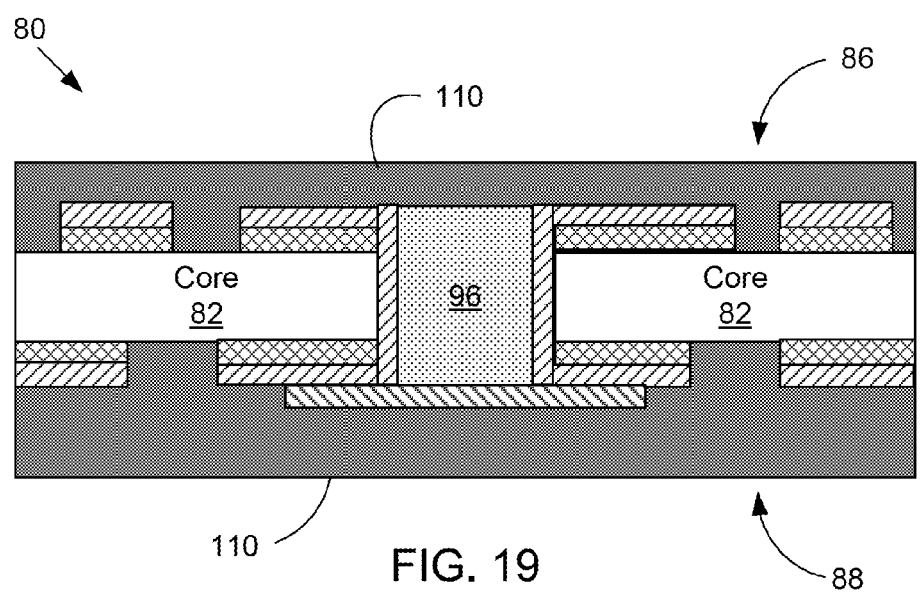
Figure 20:
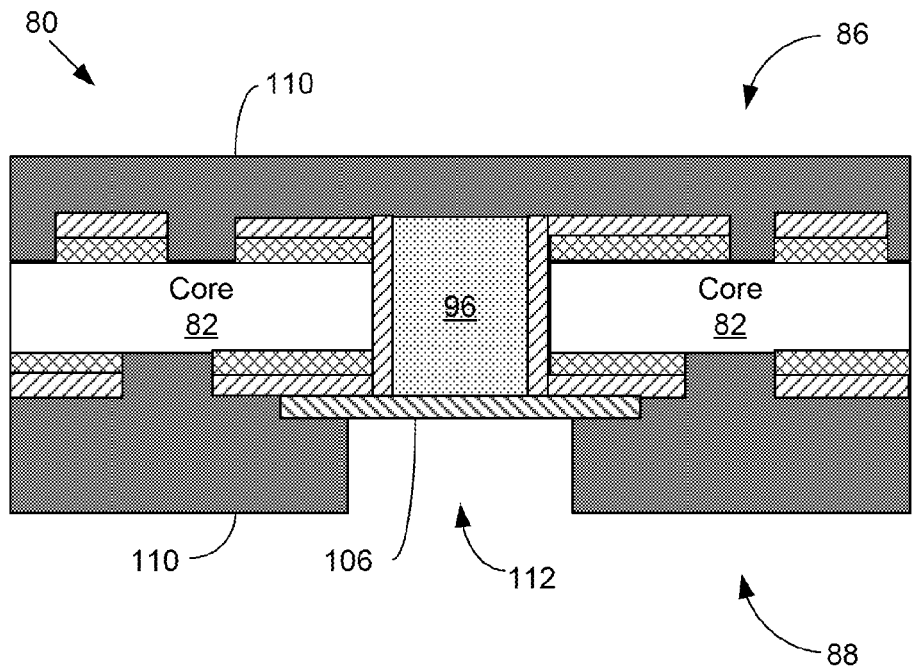
Figure 21:
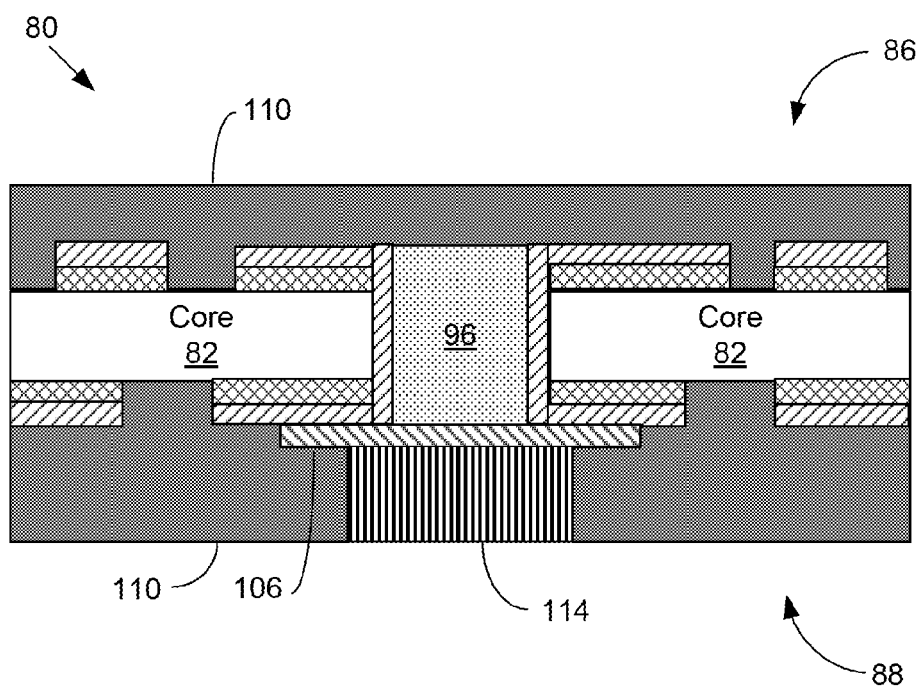

Once the substrate 80 has been trace patterned, subsequent processes may be performed in order to electrically interconnect the substrate 80 to another substrate. For example, a solder mask 110 at block 72 may be printed or deposited on both sides 86 and 88 of the substrate 80 as depicted in FIG. 19. A gap 112 may be formed in the solder mask 110 at block 74 via patterning in order to expose the conductive pad 106 as depicted in FIG. 20. The opening 112 at block 76 may then be filled with a conductive material 114, such as solder, to form an interconnect for electrically interconnecting the substrate 80 to another substrate as depicted in FIG. 21.

Although specific embodiments have been illustrated and described herein, it will be appreciated by those of ordinary skill in the art and others, that a wide variety of alternate and/or equivalent implementations may be substituted for the specific embodiments illustrated and described without departing from the scope of the present invention. This application is intended to cover any adaptations or variations of the embodiments discussed herein. Therefore, it is manifested and intended that various embodiments of the invention be limited only by the claims and the equivalents thereof.

What is claimed is:

1. An apparatus, comprising:
  a substrate having a first side and a second side, wherein the first side of the substrate is opposite to the second side of the substrate; and
  a via-in-pad structure integrated with the substrate, wherein the via-in-pad structure includes
    a via formed within a hole that extends from the first side of the substrate to the second side of the substrate, wherein the via has i) a first end located at the first side of the substrate and ii) a second end opposite to the first end located at the second side of the substrate, and wherein the via comprises a plug material formed within the hole, and
    a cap comprising a first conductive material, wherein the first conductive material is disposed on the second end of the via subsequent to formation of the plug material within the hole, wherein the cap is configured to provide a conductive pad that is directly on the second end of the via, wherein the first end of the via is without a corresponding cap comprised of the first conductive material,
  wherein the hole is defined by one or more substrate walls,
  wherein the via comprises a second conductive material plated on the one or more substrate walls,
  wherein the substrate comprises a core that includes i) a first side corresponding to the first side of the substrate and ii) a second side that corresponds to the second side of the substrate,
  wherein the apparatus further comprises a trace pattern on the first side of the core, and
  wherein the trace pattern comprises each of the second conductive material and a third conductive material.

2. The apparatus of claim 1, wherein each of the second conductive material and the third conductive material comprises copper.

3. The apparatus of claim 1, wherein:
  the trace pattern is a first trace pattern;
  the apparatus further comprises a second trace pattern on the second side of the core; and
  the second trace pattern comprises each of the second conductive material and the third conductive material.

4. The apparatus of claim 3, wherein each of the second conductive material and the third conductive material comprises copper.

5. The apparatus of claim 1, further comprising solder disposed on the conductive pad and opposite to the via.

6. A method, comprising:
  providing a substrate;
  forming a via in the substrate, wherein the via is formed within a hole that extends from a first side of the substrate to a second side of the substrate, wherein the second side of the substrate is opposite to the first side of the substrate, and wherein the via comprises (i) a first end located at the first side of the substrate, and (ii) a second end located at the second side of the substrate and opposite to the first end located at the first side of the substrate, wherein forming the via further comprises
    plating one or more walls of the hole with a first conductive material, and filing the hole with a plug material;
  constructing a conductive pad at the second end of the via, including
    subsequent to filing the hole with the plug material, selectively depositing a second conductive material directly on the second end of the via on the second side of the substrate without depositing the second conductive material onto the first side of the substrate; and
  forming a trace pattern on the first side of the substrate by patterning a layer of the first conductive material on the first side of the substrate,
  wherein providing the substrate comprises providing the substrate that includes a core comprising (i) a first side corresponding to the first side of the substrate, (ii) a second side corresponding to the second side of the substrate, and (iii) a layer of a third conductive material deposited on the first side of the core and the second side of the core.

7. The method of claim 6, wherein each of the first conductive material and the third conductive material comprises copper.

8. The method of claim 6, wherein plating the one or more walls of the hole comprises:

depositing, on the first side of the substrate, a layer of the first conductive material on the layer of the third conductive material; and patterning the layers of (i) the first conductive material on the first side of the substrate and (ii) the third conductive material on the first side of the substrate to form the trace pattern.

9. The method of claim 8, wherein the trace pattern is a first trace pattern, and plating the one or more walls of the hole further comprises:

depositing, on the second side of the substrate, a layer of the first conductive material on the layer of the third conductive material; and patterning the layers of (i) the first conductive material on the second side of the substrate and (ii) the third conductive material on the second side of the substrate to form a second trace pattern on the second side of the substrate.

10. The method of claim 6, wherein selectively depositing the second conductive material comprises:

placing a mask on the substrate that covers at least the first side of the substrate including the first end of the via; and removing the mask after the selectively depositing the second conductive material onto the second end of the via.

11. The method of claim 10, wherein selectively depositing the second conductive material further comprises:

placing the mask on the substrate to cover the second side of the substrate, and patterning the mask to provide at least an opening to expose the second end of the via; and depositing the second conductive material into the opening to form the conductive pad directly on the via.

\* \* \* \* \*